United States Patent [19]

Dimock et al.

[11] Patent Number: 4,676,884
[45] Date of Patent: Jun. 30, 1987

[54] WAFER PROCESSING MACHINE WITH EVACUATED WAFER TRANSPORTING AND STORAGE SYSTEM

[75] Inventors: Jack A. Dimock, Santa Barbara; Dirk P. Woestenburg, Summerland, both of Calif.

[73] Assignee: The BOC Group, Inc., Montvale, N.J.

[21] Appl. No.: 889,443

[22] Filed: Jul. 23, 1986

[51] Int. Cl.⁴ ............................................. C23C 14/00
[52] U.S. Cl. ...................................... 204/298; 118/50;
118/50.1; 118/500; 118/719; 118/724; 118/729;
118/730; 118/733; 414/217; 414/220; 414/221;
414/222; 414/225; 414/416; 414/417; 427/294;
427/295
[58] Field of Search ................ 204/298; 427/294, 295;
118/50, 50.1, 500, 729, 724, 730, 733, 719;
414/217, 220, 221, 222, 225, 416, 417

[56] References Cited

U.S. PATENT DOCUMENTS

| | | | |
|---|---|---|---|
| 3,833,018 | 9/1974 | Brooks | 414/220 |
| 3,874,525 | 4/1975 | Hassan et al. | 414/225 |
| 3,921,788 | 11/1975 | Roberson | 414/417 |
| 4,047,624 | 9/1977 | Dorenbos | 118/733 |
| 4,184,448 | 1/1980 | Aichert et al. | 427/295 |
| 4,311,427 | 1/1982 | Coad et al. | 118/729 |
| 4,412,771 | 11/1983 | Gerlach et al. | 414/222 |
| 4,418,646 | 12/1983 | Zajac | 118/733 |
| 4,500,407 | 2/1985 | Boys et al. | 414/217 |
| 4,522,697 | 6/1985 | Dimock et al. | 118/50 |
| 4,523,985 | 6/1985 | Dimock | 118/50 |
| 4,526,670 | 7/1985 | Hajj | 118/50.1 |
| 4,532,816 | 8/1985 | Miller | 414/217 |
| 4,534,314 | 8/1985 | Ackley | 204/298 |
| 4,544,317 | 10/1985 | Carter | 414/217 |
| 4,584,045 | 4/1986 | Richards | 204/298 |
| 4,592,306 | 6/1986 | Gallego | 118/50.1 |
| 4,592,926 | 6/1986 | Rubin et al. | 118/733 |

*Primary Examiner*—Arthur P. Demers
*Attorney, Agent, or Firm*—David A. Draegert; Larry R. Cassett

[57] ABSTRACT

An evacuable wafer processing machine includes a load-lock station, a wafer transfer station separated from the load-lock station by means of a gate-valve and a wafer coating station. Wafers contained within an evacuated wafer box are loaded into the load-lock station. The load-lock station is then closed and evacuated. A pair of pneumatically-operated plungers operable within the load-lock station, pick-up and remove the covers from the wafer box. The gate-valve is opened and the box of wafers is transferred into the wafer transfer station. Within the wafer transfer station, a wafer transfer blade passes vertically through the wafer box to serially transfer the wafers between the transfer station and the wafer coating station. After all the wafers have been coated, the wafer box is transferred through the open gate-valve into the load-lock station, the gate-valve closed and the covers replaced on the wafer box. The load-lock station is then let-up to atmosphere, thereby forcing the covers into gas-tight sealing engagement with the storage box and the storage box is removed from the loadlock station. The actuator for actuating the wafer transfer blade includes an elongated, hollow, cylindrical member containing therein a piston forced to and fro within the cylinder by pneumatics. The piston is magnetically coupled through the walls of the cylinder to a slider having the wafer transfer blade affixed thereto.

20 Claims, 11 Drawing Figures

WAFER PROCESSING MACHINE WITH EVACUATED WAFER TRANSPORTING AND STORAGE SYSTEM

BACKGROUND OF THE INVENTION

The present invention relates in general to wafer processing machines and, more particularly, to machines of the character operating at subatmospheric pressure, such as sputter coating machines, and employing evacuated wafer transport and storage containers.

DESCRIPTION OF THE PRIOR ART

Heretofore, sputter coating machines have included a load-lock door closing off one end of an evacuable chamber. Wafers to be coated were carried in a cassette and loaded and unloaded from the cassette by an elevator blade movable up to a wafer chuck carried from the inside surface of the load-lock door. A clamping ring clamped the wafers to the chuck and the chuck advanced the wafer through an open throat of a gate valve into a coating station opposite a magnetron sputter gun carried from a second end door of the chamber. The second end door of the chamber was movable away from the chamber on guide rails and pivotable on an axis for ease of maintenance of the sputter gun. Such a wafer processing machine is disclosed and claimed in U.S. Pat. Nos. 4,522,697 issued June 11, 1985, and 4,523,985 issued June 18, 1985.

As the semiconductor wafer processing technology improves, it is desirable to reduce particulate contamination of the wafers to reduce defect density in the resultant chips. Moreover, to make devices with faster operating time, it is desirable to go to gallium arsenide as the semiconductor wafer material. Gallium arsenide semiconductor wafers are much more fragile than silicon wafers of the same dimensions and, therefore, greater care must be exercised in handling and processing of gallium arsenide wafers to avoid undue breakage and loss of product.

Accordingly, it is desirable to provide an improved wafer processing machine and accompanying wafer transport and storage system which reduces particulate contamination of the wafers and which minimizes damage to the wafers during handling for processing.

SUMMARY OF THE PRESENT INVENTION

The principal object of the present invention is the provision of an improved wafer processing machine of the type operating at subatmospheric pressure and having an improved wafer transport and storage system for reducing particulate contamination.

In one feature of the present invention, wafers to be processed or having been processed are stored and transported by being carried within an evacuated container having a wafer access port therein which is closed by means of a cover held in place by pressure of the surrounding atmosphere, whereby wafers are stored and transported at subatmospheric pressure to reduce particulate contamination and oxidation.

In another feature of the present invention, the evacuated wafer transport and storage container is introduced into a loadlock chamber which is then evacuated, the cover removed and the wafers accessed by means of a wafer transfer member operable through the wafer access port for transferring wafers between the evacuated container and other regions of the processing chamber, whereby wafers are transferred from the storage container to the processing regions of the chamber without being exposed to atmospheric pressure.

In another feature of the present invention, the evacuable wafer transport or storage container has a pair of aligned access ports, each with its respective cover and the wafer transfer member passes into and through the pair of aligned access ports for transferring wafers between the evacuated container and other regions at subatmospheric pressure.

In another feature of the present invention, the wafer processing machine includes a load-lock station into which the evacuated wafer storage and transport container is loaded. The load-lock is then evacuated and means operatively associated with the load-lock chamber remove the covers from the evacuated storage box. The open evacuated wafer storage box is then transferred at subatmospheric pressure to a wafer transfer station at which point wafers are serially transferred between the storage box and a coating station. After the wafers within the box have all been processed, the box is transferred back to the load-lock, the covers replaced and the load-lock let up to atmospheric pressure for sealing the storage box containing the processed wafers, which are then removed from the load-lock for transport and storage.

In another feature of the present invention, the wafer transfer mechanism, operable within the evacuated wafer processing machine, includes a lifting portion for engaging the edge of the wafer and lifting it out of the wafer storage box. In addition, the wafer lifting member includes a back rest portion to receive the back of the wafer. The lifting member travels along an axis inclined to the vertical so that the wafers lean under gravitational force against the back rest portion of the lifting blade while transferring the wafers into and out of the evacuated wafer storage box.

In another feature of the present invention, the wafer transfer mechanism includes a hollow elongated finger portion of the vacuum wall of the evacuated processing machine and containing a ferromagnetic forcing member magnetically coupled through the wall of the finger to a slider operable on the finger inside the evacuated chamber for imparting movement to the wafer transport mechanism through the vacuum wall, whereby the operating life of the wafer transfer mechanism is increased in use.

In another feature of the present invention, the evacuated wafer storage and transport box includes means on the end to receive and cooperate with a storage box transfer member for moving the wafer storage box relative to the load-lock station.

In another feature of the present invention, the wafer storage box includes an indexing means operatively associated with the box for determining the position of the wafers within the box.

In another feature of the present invention, one or more covers of the box include ferromagnetic structure for cooperative engagement with magnetic cover moving means for opening and closing the box at subatmospheric pressure.

Other features and advantages of the present invention will become apparent upon a perusal of the following specification taken in connection with the accompanying drawings wherein:

DESCRIPTION OF PREFERRED EMBODIMENTS

Figure 1:
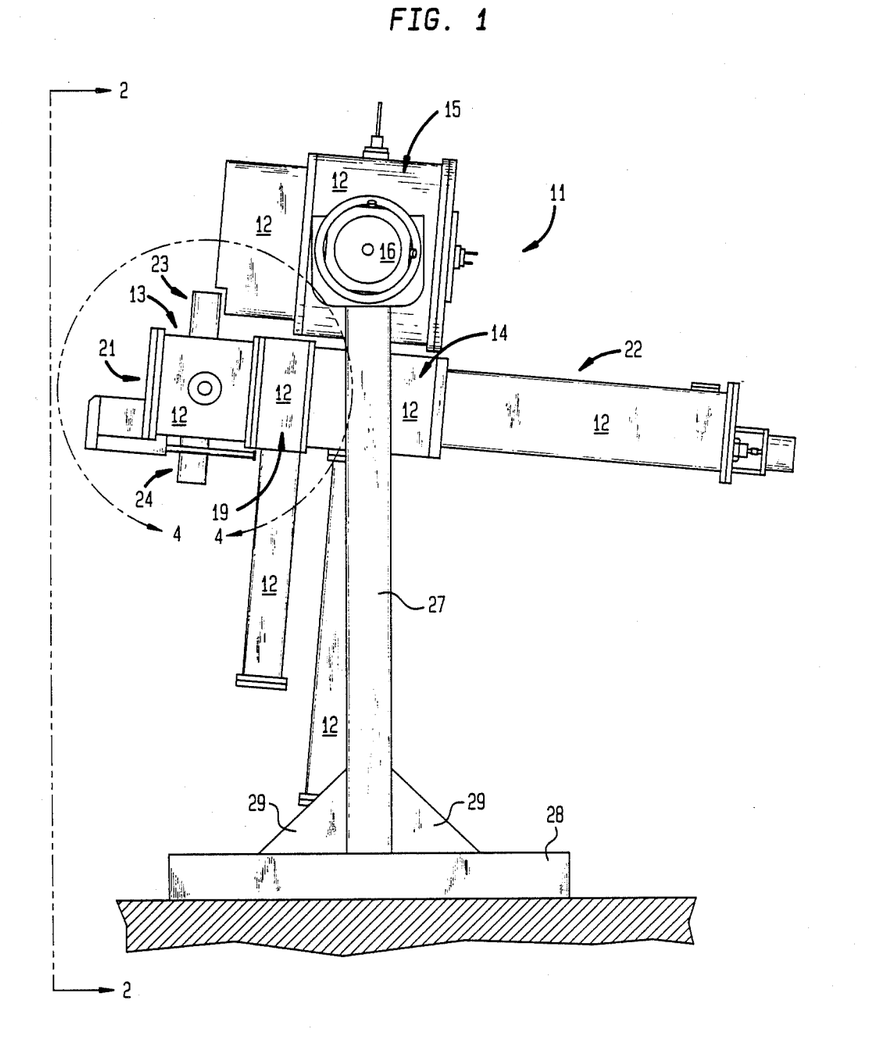
FIG. 1 is a side elevational view of a wafer processing machine incorporating features of the present invention.
Figure 2:
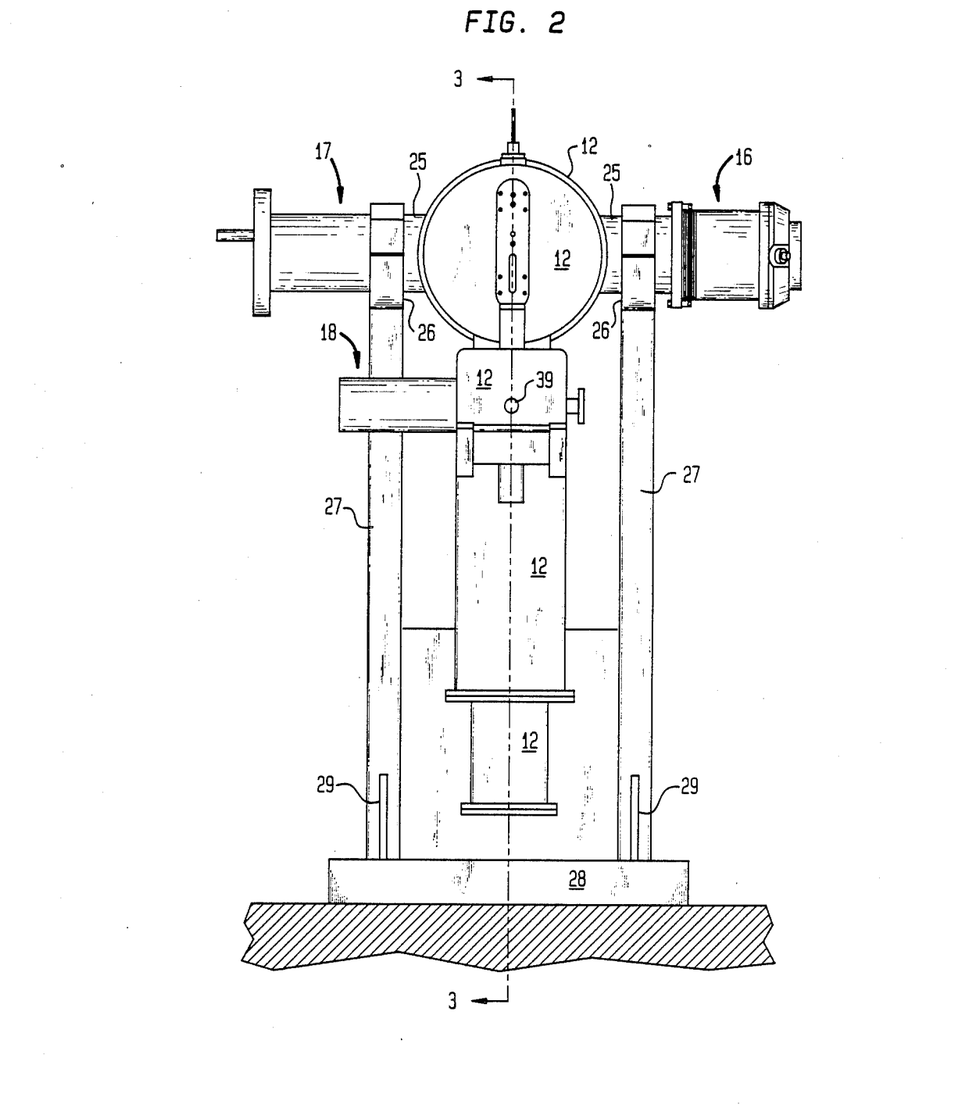
FIG. 2 is an end view of the structure of FIG. 1 taken along line 2—2 in the direction of the arrows.

Referring now to FIGS. 1 and 2, there is shown a wafer processing machine 11 incorporating features of the present invention. The machine includes an evacuable chamber 12 including a load-lock portion 13 through which wafers to be processed are introduced and removed from the evacuated processing chamber 12. The chamber also includes a wafer transfer station 14 within which wafers are transferred from a container, more fully described below, into a coating station 15 where the wafers are coated, as by sputter deposition. After coating, the wafers are transferred back to the wafer transfer station 14 and thence to the load-lock 13 and through the load-lock 13 to atmospheric pressure.

A turbomolecular pump 16 is coupled in gas communication with the evacuated chamber 12 for maintaining the vacuum therein. Also, a liquid nitrogen trap 17 is coupled in gas communication with the chamber 12 to aid in the pumping mechanism by removing condensibles, particularly water vapor. A mechanical pump, not shown, is also connected to the chamber 12 in the vicinity of the coating station 15. In addition, a turbomolecular pump, liquid nitrogen trap and mechanical pump 18 are coupled in gas communication with the load-lock portion 13 for providing an independent means for evacuating the load-lock station 13.

A gate-valve 19 is disposed intermediate the load-lock station 13 and wafer transfer station 14 for valving off the load-lock relative to the remainder of the vacuum chamber 12 so that the main chamber may be pumped to a relatively low pressure as of $10^{-3}$ to $10^{-8}$ torr and maintained at that pressure without being let up to atmospheric pressure as encountered within the load-lock station 13 while loading and unloading wafers from the evacuated processing chamber 12.

In operation, wafers contained within an evacuated wafer transport and storage box, to be more fully described below, are loaded into the load-lock station 13 by opening a drawer portion 21 and inserting the evacuated container having the wafers therein. The drawer is then closed for sealing of the chamber 12. The pumps 16, 17 and 18 then evacuate both the main chamber 12 and load-lock chamber 13 to relatively low pressure within the aforecited range. A pair of pneumatic cylinders 23 and 24 operable within the load-lock 13 remove the covers from the wafer storage box. The gate valve 19 is then opened and a wafer box transfer member is axially translatable of an elongated portion 22 of the chamber 12 through the wafer transfer station 14 and gate valve 19 into the load-lock 13 to pick up the wafer storage box and to move the wafer storage box back into the wafer transfer station 14.

Within the wafer transfer station 14, the wafers are serially transferred by a lifting blade from the open wafer storage box into the coating station 15 for coating and then returned to the wafer storage box. When all of the wafers within the wafer storage box have been coated, the wafer storage box transfer mechanism is actuated to move the processed wafers, within their storage box, back into the load-lock 13. Next, the gate-valve 19 is closed, the covers replaced by plungers 23 and 24 and the load-lock 13 let up to atmospheric pressure to thereby close the wafer storage box due to the atmospheric pressure exerted on the covers. Then, the drawer 21 is opened and the wafer storage box removed.

The evacuable wafer processing chamber 12 is supported from the floor by means of a pair of trunions 25 comprising hollow, cylindrical portions of the chamber 12 passing through bearings 26 at the upper end of a pair of legs 27 affixed to a rectangualr base structure 28 supported from the floor. Corner brace members 29 brace the legs 27 to the base support 28.

Referring now to FIGS. 3-8, the evacuated wafer storage and transport box and associated load-lock chamber 13 will be described in more detail. More particularly, the load-lock drawer 21 includes an end closing wall 31 carrying a resilient O-ring 32 around its inside perimeter for mating with a flanged portion 33 of the vacuum wall 12 of the chamber at the outer end of the load-lock station 13. The O-ring 32 mates with the flange 33 to form a gas-tight seal therewith when the door 31 is pulled into sealing engagement with the flange 33. The door 31 includes a bracket assembly 34 fixedly secured to and extending outwardly from the door 31. A pair of guide rails 35 are carried from the brackets 34 and they extend through linear ball-bearing assemblies 36 carried within bearing housings 37 affixed to the flange 33.

Figure 3:
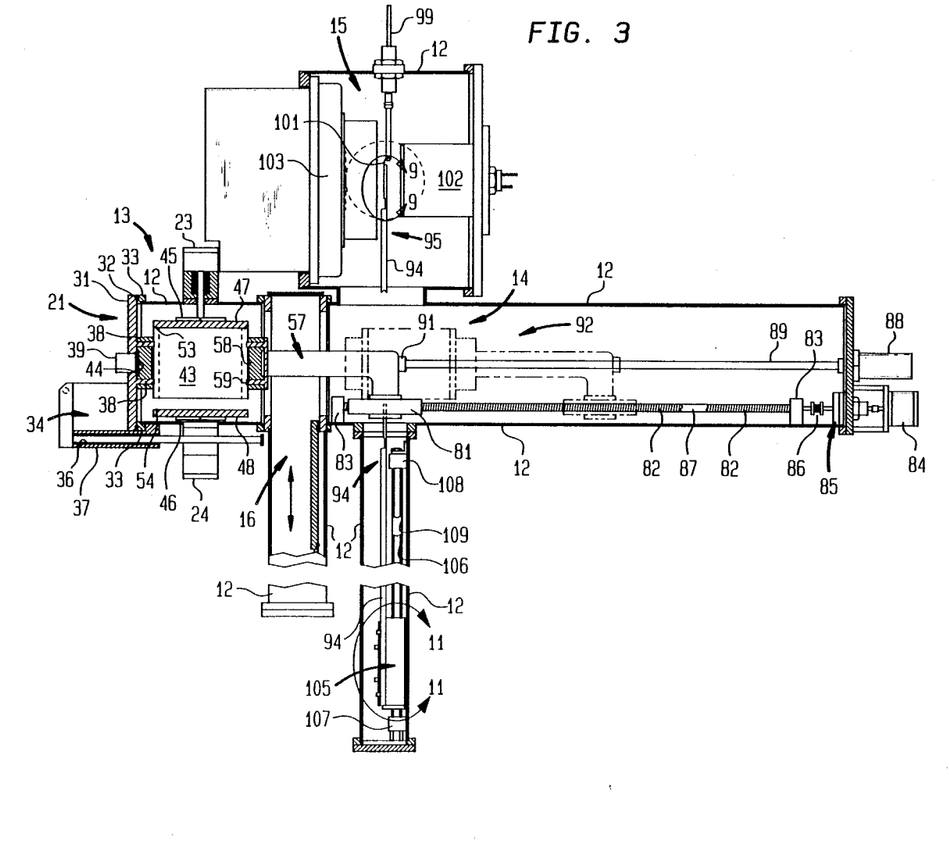
FIG. 3 is a longitudinal sectional view of the structure of FIG. 2 taken along line 3—3 in the direction of the arrows and partially dissected.
Figure 4:
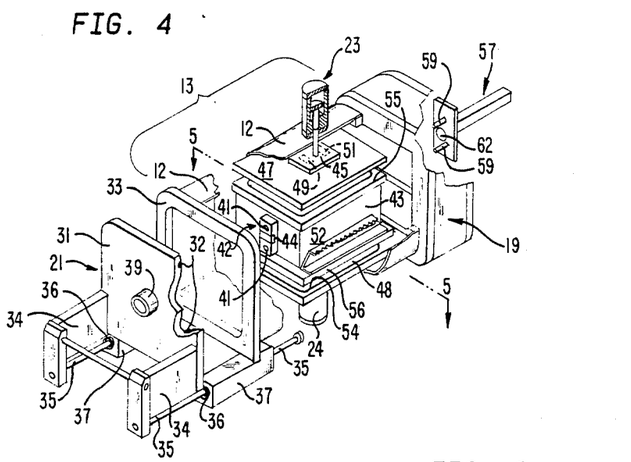
FIG. 4 is an enlarged perspective exploded and cutaway view of a portion of the structure of FIG. 1 delineated by line 4—4.

The door 31 includes a pair of vertically displaced pins 38 extending normal to the plane of the door 31 and into the chamber 12 above and below an electromagnet 39. The pins 38 penetrate bores 41 in a block structure 42 carried from the end of an evacuable wafer storage and tranpsort box 43. A magnetically permeable insert 44, as of magnetic stainless steel, is carried within the block 42.

The evacuated wafer storage and transport box 43 is loaded, as by hand, onto the pins 38 and the electromagnet 39 energized to magnetically interact with the ferromagnetic insert 44 to cause the box to be held to the door 31 and on the pins 38. The box 43 is loaded with the door 31 withdrawn to its outermost extent of travel on the guide rails 35. After the box 43 has been loaded, the door 31 is closed, the vacuum pumps 18 are then energized to evacuate the load-lock station 13. Concurrently, before the load-lock station 13 is evacuated, pneumatic cylinders 23 and 24 are energized to drive a pair of plungers 45 and 46 inwardly of the load-lock station 13 and into engagement with top and bottom rectangular ferromagnetic plates 47 and 48, as of magnetic stainless steel, serving as top and bottom cover plates, respectively, for the wafer storage and transport box 43. The plungers 45 and 46 each include a pair of permanent magnets 49 and 51 which exert a magnetic attraction on the ferromagnetic cover plates 47 and 48. The plungers hold the cover plates in place during evacuation of the load-lock station.

After the load-lock station 13 has been evacuated, the pneumatic cylinders 23 and 24 are actuated in the opposite direction to pull the cover plates 47 and 48 away from the wafer storage and transport box 43 for opening the top and bottom sides of the box 43. The top and bottom cover plates 47 and 48 are sealed to the side walls 52 of the storage box by means of a pair of resilient o-ring members 53 and 54 carried within grooves near the periphery of the respective cover plates 47 and 48, respectively. The side walls of the wafer storage and transport box 43 are terminated at their upper and lower lips by means of generally rectangular annular flange members 55 and 56, respectively, forming access ports which are sealed by the O-rings 53 and 54. The actuating shafts of the pneumatic cylinders 23 and 24 are sealed in a gas-tight manner by quad-rings wiping on the exterior surface of the pneumatic operated shafts in the conventional manners.

After the cover plates 47 and 48 have been retracted from the box 43, a wafer storage box transfer plunger 57 is advanced into engagement with block structure 58 carried from the other end of the wafer storage box 43 and the electromagnet 39, as carried on the door 31 of the load-lock chamber 13 is de-energized. The transfer plunger 57 includes a pair of pins 59 to be received within aligned bores 61 in the block structure 58. The plunger 57 includes permanent magnet member 62 for magnetic attractive engagement with the ferromagnetic insert 44 in the end block 58. This magnetic attractive force holds the storage box 43 to the plunger 57. The plunger 57 is then withdrawn transferring the storage box 43 to the wafer transfer station 14.

Figure 8:
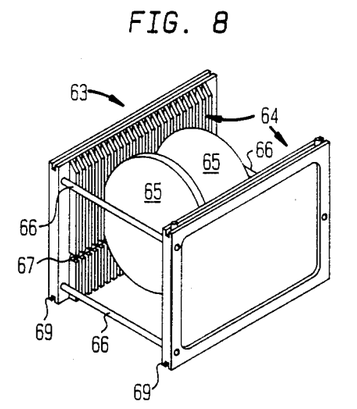
FIG. 8 is a perspective view of a cassette which fits within the structure of FIGS. 5-7.

The wafer transport and storage box 43 receives therewithin a conventional metallic cassette structure 63 of the type shown in FIG. 8 which is commercially available as Model 85-6, 5, 4, 3 from H. Square Corp. of Sumnnyvale, Calif. The cassette 63 includes a pair of grooved vertical side wall portions 64; the grooves extending vertically and disposed in transverse registration on opposite side wall such that the wafers 65 to be processed are held at their opposite side edges by riding within transversely aligned grooves in the side wall portions 64. The side walls 64 are held to each other by means of transversely extending pins 66. A pair of longitudinally directed pins 67 pass transversely through the lands in the grooved side walls 64 to serve as stops to prevent the wafers 65 from dropping through the cassette 63.

The side walls 64 of the cassette 63 are provided with longitudinal grooves 69 at the base of the side walls 64 to receive and be supported upon axially directed pins 71 carried from opposite end walls of the storage box 43. A second set of inwardly displaced pins 72 engage the inner land portions longitudinally grooved walls 64 for assisting in retaining the cassette 63 in the proper position within the storage box 43.

Figure 5:
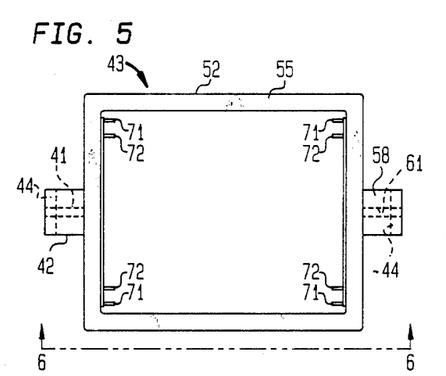
FIG. 5 is a plan view of a portion of the structure of FIG. 4 taken along line 5—5 in the direction of the arrows.
Figure 6:
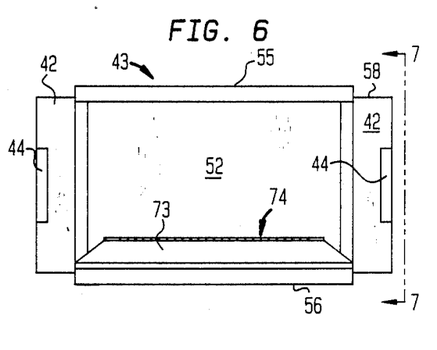
FIG. 6 is a side-elevational view of the structure of FIG. 5 taken along line 6—6 in the direction of the arrows.
Figure 7:
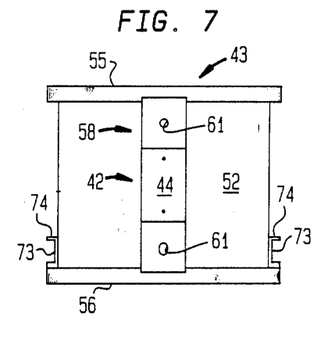
FIG. 7 is an end view of the structure of FIG. 6 taken along line 7—7 in the direction of the arrows.

A wafer indexing bracket 73 is affixed along opposite sides of the box 43 at the base thereof. The indexing brackets include a serrated outwardly directed flange portion 74. The spatial period of the serrations in the flange 74 correspond to the spatial period of the grooves in the grooved side wall 64 of the cassette 63 such that the serrations may be utilized as an indexing means for indexing the position of the wafers 65 within the storage box 43. An optical detector, consisting of a light emitting diode and a photodiode are disposed on opposite sides of the serrated flange 74 at the wafer transfer, serve to give an electrical output corresponding to the position of the wafers 65 within the storage box 43 in the manner as disclosed in the aforecited U.S. Pat. No. 4,522,697 the disclosure of which is hereby incorporated by reference in its entirety.

Indexing brackets 73 are provided on both sides of the box 43 and the end members 42 and 58 of the box 43 are identical and symmetrical so that the box may be turned end for end and no difference in its operation or interaction with the load-lock station 13 and wafer transfer station 14 would be obtained.

Referring now to FIG. 3, the wafer transfer station 14 will be described in greater detail. More particularly, the wafer box transfer plunger 57 includes a drive nut portion 81 threadably mated with a drive screw 82 extending axially of the elongated portion of the vacuum envelope 12 in which it is mounted. The drive screw 82 is mounted to the inside wall of the vacuum envelope by means of a pair of bearing blocks 83 disposed at opposite ends of the drive screw 82. Drive screw 82 is rotationally driven by means of a motor 84 coupled to the drive screw 82 by means of a conventional magnetic rotary feedthrough assembly 85. The motor 84 is coupled to the drive screw 82 via the intermediary of a clutch 86.

A guide rod 87 is disposed in laterally spaced relation and parallel to the drive screw 82 and is fixedly secured, at both ends, to the bearing blocks 83. The wafer box transfer plunger 57 includes a linear ball-bearing assembly riding on the guide rod 87 for providing lateral stability and additional load-bearing support for the wafer box transfer plunger 57.

A magnetostrictive linear displacement transducer system 88, such as that commercially available as Model DCTM-12,24 from Temposonics, Inc. of Plainview, N.Y., provides an output determinative of the position of the storage box transfer plunger 57 on the drive shaft 82. The linear displacement transducer system 88 includes a transducer beam 89 and a positioning head magnet 91 fixedly mounted to the plunger 57 and slideably mounted on the fixed transducer beam 89. The magnet 91 and transducer beam 89 are mounted vertically above and parallel to the guide rail 87 so as to provide an unobstructed lateral access space for the wafer lifting blade structure, to be described below, to pass between the drive screw 82 and rods 87 and 89.

In operation, the motor 84 is actuated to produce rotation of the drive screw 82 which causes the drive nut 81 to traverse the drive screw 82. After the wafer box transfer plunger 57 has engaged and picked up the wafer storage and transport box 43, the motor 84 is energized to retract the box 43 and plunger 57 to the wafer transfer station 14, as shown in dotted lines at 92. When the wafer box transfer plunger 57 has reached the desired transfer station 14, as determined by the output of the linear displacement transducer system 88, the optical indexing system at the wafer transfer station 14 determines the position of the starting wafer within the cassette 63 as carried within the wafer storage box 43.

The motor 84 is energized to bring the wafer over a lifting blade 94. The wafer lifting blade 94, vertically disposed below the wafer storage box 43, is energized to be rectilinearly translated generally in the vertical direction through the opened wafer storage box 43 and cassette 63 to pick up the wafers 65 serially and to transport the wafer vertically to the wafer coating station 15, as shown in solid lines at 95.

Figure 9:
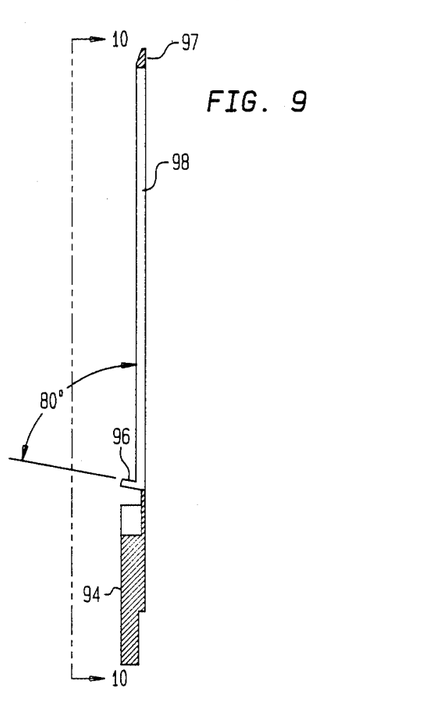
FIG. 9 is an enlarged sectional view of a portion of the structure of FIG. 3 delineated by line 9—9.
Figure 10:
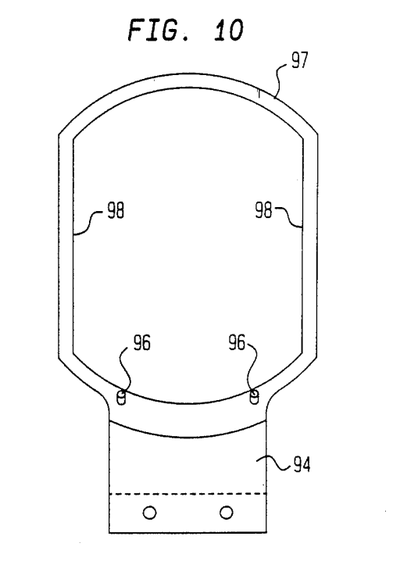
FIG. 10 is a reduced view of the structure of FIG. 9 taken along line 10—10 in the direction of the arrows.

The wafer lifting blade 94 is shown in greater detail in FIGS. 9 and 10. The upper portion of the blade 94, which engages the respective wafers 65, includes a pair of pins 96 which engage the lower edge of the wafer 65 for lifting the wafer 65 up through the cassette 63. The upper end of the lifting blade also includes a ring-shaped back rest portion 97 having truncated side edges 98 to facilitate passage through the cassette 63.

The wafer lifting blade 94 traverses a generally vertical path which is inclined to the vertical by a relatively small angle as of 5 to 20 degrees such that the vertical gravitational forces on the wafer 65 will cause it to lean up-against the back rest 97 and to be supported thereon as the wafer 65 is lifted on the pins 96 from the wafer transfer station 14 to the coating station 15. The pins 96 are also inclined at an angle of 80° to the plane of the back rest 97 to accomodate the tilt of the lifting blade 94 relative to the vertical.

Referring now to FIG. 3, an electrical feedthrough 99 is disposed at the upper end of the processing chamber 12 above the coating station 15 and includes a resilient wiper leafspring member 101 which engages and makes electrical contact to the upper end of the back rest 97 for applying an electrical bias to the wafer 65 for enhancing sputter coating, as desired. The lifting blade includes an electrically insulative section below the blade 94 to allow electrical isolation of the blade 94. a heater assembly 102 is coaxially disposed of the wafer in close proximity thereto for heating the wafer to a desired deposition temperature.

A sputter deposition gun 103, of the type more fully disclosed in the aforecited U.S. Pat. No. 4,522,697, is coaxially disposed of the wafer 65 in the coating station 15 for sputter coating of the wafer 65.

After the wafer 65 has been coated, the wafer lifting blade 94 is retracted back through the cassette 63 to deposit the coated wafer into the cassette. Next, the optical indexing means 74 in cooperation with the drive screw 82 and drive motor 84 is actuated to advance the storage box 43 to the next wafer 65 in the cassette 63 so that the next wafer is positioned in vertical registration over the wafer lifting blade 94 and the coating process is repeated. After all of the wafers in the storage box 43 and cassette 63 have been coated, the drive motor 84 is energized to return the storage box 43 and plunger 57 to the load-lock station 13.

When the wafers have been returned to the load-lock station 13, the cylinders 23 and 24 are energized to place the cover plates 47 and 48 over the access ports in the wafer storage box 43, such plates being held in firm engagement therewith by means of the pneumatic cylinders 23 and 24. The electromagnet 39 carried from the load-lock door 31 is then energized to hold the storage box to the load-lock door 31. The wafer box transfer plunger 57 is then withdrawn to the wafer transfer station 14 as indicated at position 92 and the gate valve, as disclosed in the aforecited U.S. Pat. No. 4,523,985, is then closed.

The load-lock chamber 13 is then let up to atmospheric pressure which causes the atmospheric pressure to further force the closing plates 47 and 48 into gas-tight sealing engagement with the side walls and flanges 55 and 56 of the box 43, thereby closing the access ports of the wafer storage box 43. The pneumatic cylinders 23 and 24 are then actuated to withdraw plungers 45 and 46 and the load-lock access door 31 can then be pulled opened and the evacuated wafer storage box 43 removed.

Figure 11:
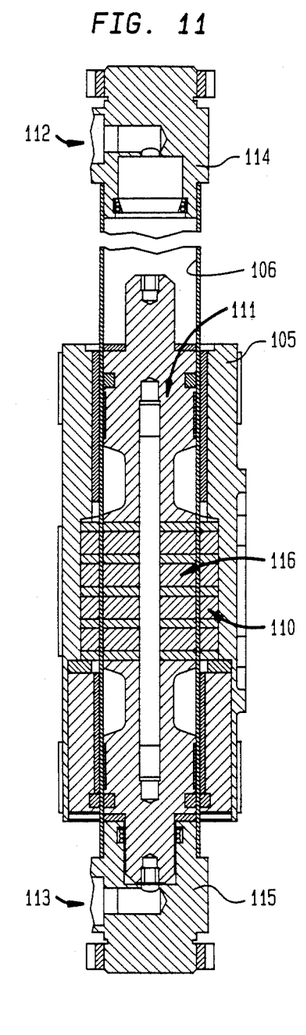
FIG. 11 is an enlarged sectional view of a portion of the structure of FIG. 3 delineated by line 11—11.

Referring now to FIGS. 3 and 11, the wafer transfer blade actuating structure will be described in greater detail. More particularly, the wafer lifting blade 94 is operable within an elongated, generally vertically oriented rectangular envelope portion of the evacuated processing chamber 12. The lifting blade 94 is carried from a slider assembly 105 which slides on a hollow, cylindrical finger 106 extending axially of the envelope portion 12 and secured to the inside wall thereof via mounting brackets 107 and 108 at opposite ends of the elongated envelope portion 12.

The slider assembly 105 includes a pair of slider members laterally displaced with respect to each other, one riding on the hollow, cylindrical finger 106 and the other riding on a guide rod 109 laterally spaced and parallel to the hollow, cylindrical finger 106. Both finger 106 and the guide rod 109 are carried from the inside wall of the chamber 12 via the end mounting brackets 107 and 108, respectively. That portion of the slider 105 which slides on the guide rod 109 includes a linear ball-bearing assembly coaxially mounted of the guide rod 109, whereas the slider portion which rides on the hollow, cylindrical finger 106 includes a permanent magnet yoke assembly 110 riding on the outside of the hollow, cylindrical finger 106 and is shown in substantial detail in FIG. 11.

The hollow, cylindrical finger 106 forms a portion of the wall of the processing chamber 12 and contains therein a piston 111 which is slidably rectilinearly translatable axially of the cylindrical finger 106 in response to gas pressure applied to the interior of the finger 106 via gas ports 112 and 113 formed in end closure members 114 and 115, closing off the ends of the hollow, cylindrical finger 106. Tubes, not shown, provide a source of gas pressure which may be applied to either one of the gas ports 112 or 113 relative to the other for urging the piston 111 in one direction or the other within the hollow cylindrical finger 106.

The piston 111 includes an axial array of permanent magnet members 116 for producing intense magnetic fields which loop through the thin wall of the cylindrical finger 106 for magnetic attractive operation with a similar array of annular magnets, forming the yoke assembly 110 at the inner periphery of the slider 105. Thus, the force exerted on the piston 111 by the pneumatics connected to gas ports 112 and 113 serve to force the piston 111 to and fro within the hollow, cylindrical finger 106, whereas the slider 105 is caused to follow and to be magnetically coupled for movement with the piston 111 by means of the cooperative magnet arrays 116 and 110. This type of actuator is called a rodless, linear drive cylinder and is commercially available from Festo Pneumatic Co., of Hauppauge, N.Y.

The advantages of the wafer processing machine employing evacuated wafer transport and storage boxes 43 of the present invention include the ability to coat the wafers, to transport the wafers and to store the wafers without exposing the wafers to the ambient atmosphere. Storage of the wafers at subatmospheric pressure greatly reduces particulate contamination and oxidation, thereby improving device yield and decreasing defect density. Tilting the wafer transfer mechanism relative to vertical allows the wafers to be supported on the lifting blade by gravitational forces along, thereby simplifying and reducing the handling of the wafers within the evacuated chamber. By reducing the handling of the wafers, less breakage of fragile wafers, such as those of gallium arsenide material, is obtained in use. The rodless linear drive cylinder, incorporating the magnetic coupling through the elongated, hollow finger 106 allows many more cycles of operation than the conventional bellow seal arrangements which can fatigue and, therefore, have only limited life.

What is claimed is:

1. In a method for storage and transport of wafers, the steps of:
   evacuating a transportable housing containing an array of wafers and its surrounds to subatmospheric pressure;
   placing and sealing a closure over an access port in the evacuated housing at subatmospheric pressure for closing the housing; and
   raising the pressure of the surrounds of the closed and sealed housing to atmospheric pressure relative to the subatmospheric pressure on the interior of said housing to cause said closure to be urged into gaseous sealing engagement with the evacuated housing by atmospheric pressure, whereby the wafers are contained in an evacuated transportable housing for transport and storage at atmospheric pressure.

2. The method of claim 1 including the step of:
   passing a wafer transfer member at subatmospheric pressure through the wafer access port into the evacuated housing for transferring wafers between the evacuated housing and other regions at subatmospheric pressure.

3. The method of claim 1 wherein the evacuated housing containing the wafers has a pair of aligned access ports therein on opposite sides of the housing; and
   passing a wafer transfer member into and through the pair of aligned access ports in the evacuated housing and transferring wafers between the evacuated housing and other regions at subatmospheric pressure.

4. In a method of transferring and processing wafers at subatmospheric pressure, the steps of:
   containing and transporting an array of wafers within an evacuated housing surrounded by atmospheric pressure, such housing having a wafer access port closed by a closure held in sealing engagement at least partially by the surrounding atmospheric pressure;
   introducing the evacuated housing into a wafer processing chamber;
   removing the closure from the wafer access port within the wafer processing chamber at subatmospheric pressure to expose the wafers to the subatmospheric pressure within the processing chamber;
   transferring wafers between the housing and regions of the processing chamber at subatmospheric pressure;
   placing a closure over the wafer access port; and
   raising the pressure of the atmosphere surrounding the evacuated housing to atmospheric pressure such that the closure is held in gas-tight sealing engagement over the wafer access port at least partially by the surrounding atmospheric pressure.

5. In an apparatus for storage and transport of wafers;
   an evacuable and transportable housing for containing an array of wafers;
   said housing having an access port therein for accessing the wafers contained within said housing;
   closure means for closing and sealing said access port in said housing; and
   means for producing a pressure differential between the pressure of the surrounds of said housing relative to the subatmospheric pressure contained within said housing to cause said closure means to be urged into gaseous sealing engagement with the evacuated housing by atmospheric pressure, whereby the wafers are contained in an evacuated transportable housing means for transport and storage at atmospheric pressure.

6. The apparatus of claim 5 including:
   wafer transfer means operable at subatmospheric pressure through said wafer access port into the evacuated housing means for transferring wafers between said evacuated housing and other regions at subatmospheric pressure.

7. The apparatus of claim 5 wherein said evacuated housing means for containing the wafers has a pair of aligned access ports therein on opposite sides of said housing means; and
   wafer transfer means operable through said pair of aligned access ports in said evacuated housing for transferring wafers between said evacuated housing means and other regions at subatmospheric pressure.

8. The apparatus of claim 6 wherein said wafer transfer means includes a hollow elongated finger protruding into a region of subatmospheric pressure which envelopes said evacuated wafer containing housing;
   ferromagnetic means axially movable internally of said hollow finger and being partitioned from the wafer enveloping region of subatmospheric pressure by the walls of said hollow finger;
   slider means axially movable of said elongated finger on the outside of said finger and being magnetically coupled to said ferromagnetic means internal of said finger for movement therewith;
   wafer carrier means mechanically coupled to and movable with said slider means for transferring wafers between said evacuated housing and other regions at subatmospheric pressure; and
   forcing means operable within said finger for moving said ferromagnetic means within said finger to produce a corresponding axial movement of said slider means and said wafer carrier means, whereby the operation life of said wafer transfer means is extended in use.

9. In an apparatus for processing wafers at subatmocpheric pressure the steps of:
   wafer container means for containing and transporting an array of wafers at subatmospheric pressure when said container means is surrounded by atmospheric pressure;
   said wafer containing means having a wafer access port therein for accessing the wafers contained within said container means;

closure means for closing said access port and for sealing said access port in gas-tight relationship at least partially by the surrounding atmospheric pressure exerting a closing force on said closure means;

wafer processing chamber means for processing wafers at subatmospheric pressure;

means for introducing the wafers to be processed into said wafer processing chamber means;

means operable within said wafer processing chamber means at subatmospheric pressure for removing said closure means from said wafer access port to expose the wafers to the subatmospheric pressure within said wafer processing chamber means;

wafer transfer means operable within said processing chamber at subatmospheric pressure for transferring wafers between said wafer containing means and regions of the processing chamber at subatmospheric pressure;

means operable within said wafer processing chamber for placing said closure means over said wafer access port; and means for raising the pressure of the atmosphere surrounding said evacuated wafer containng means to atmospheric pressure such that such closure means is held in gas-tight sealing engagement over said wafer access port at least partially by the surrounding atmospheric pressure.

10. The apparatus of claim 9 wherein said wafer transfer means includes a hollow, elongated finger protruding into said processing chamber;

ferromagnetic means axially movable internally of said hollow finger and being partitioned from the wafer enveloping region of subatmospheric pressure within said chamber by means of the walls of said hollow finger;

slider means axially movable of said elongated finger on the outside of said finger and being magnetically coupled to said ferromagnetic means internally of said finger for movement therewith;

wafer carrier means mechanically coupled to and movable with said slider means for transferring wafers between said evacuated wafer container means and other regions at subatmospheric pressure; and forcing means operable within said finger for moving said ferromagnetic means within said finger to produce a corresponding axial movement of said slider means and said wafer carrier means, whereby the operating life of said wafer transfer means is extended in use.

11. In a wafer processing machine of the type wherein wafers are coated in an evacuable wafer processing chamber at subatmospheric pressure;

said wafer processing chamber having an access port in a wall thereof for accessing the interior of said chamber;

chamber closure means for opening and closing said access port of said wafer processing chamber;

an evacuated wafer storage box containing wafers to be processed, said wafer storage box having a removable cover for controlling access to the contained wafers;

support means carried from said chamber closure means for supporting said wafer storage box;

closure translation means for translating said chamber closure means and supported wafer storage box relative to said chamber access port for transfer of the wafer storage box through said chamber access port between the surrounds of said chamber and the interior of said chamber;

pump means for evacuating said evacuable wafer processing chamber to subatmospheric pressure; and cover transfer means operatively associated with said evacuable wafer processing chamber for transferring said cover of said evacuated wafer storage box between an open and close state at subatmospheric pressure within said evacuable wafer processing chamber.

12. The apparatus of claim 11 including:

wafer box translating means operable within said evacuable wafer processing chamber for translating the opened wafer storage box relative to said support means.

13. In a wafer processing machine for coating wafers therein at subatmospheric pressure:

an evacuable chamber having a load-lock station, a wafer transfer station, and a wafer coating station therein;

loading means for loading an evacuated wafer storage box into said load-lock station;

valve means disposed intermediate said load-lock station and said wafer transfer station for valving off said load-lock station relative to said wafer transfer station to allow an independent gas pressure to be established in said load-lock station relative to said wafer transfer station;

wafer storage box transfer means for translating the wafer storage box between said load-lock station and said wafer transfer station and through said valve means; and wafer transfer means operable at subatmospheric pressure at said wafer transfer station for translating wafers between the wafer storage box and said evacuated wafer coating station.

14. The apparatus of claim 13 including:

cover translating means operable within said load-lock station for translating a cover on the evacuated wafer storage box relative to the box as disposed within said load-lock station.

15. The apparatus of claim 13 wherein said wafer transfer means includes a wafer lifting blade means having a lifting portion and a back rest portion for rectilinear translation in the generally vertical direction through the wafer storage box and along an axis inclined from the vertical and extending between said wafer transfer and wafer coating stations so that the wafer being transferred will be picked up by said lifting portion engaging a lip of the wafer and the wafer will lean under gravitational force against said back rest portion of said lifting blade means.

16. The wafer processing machine of claim 13 wherein said wafer transfer means includes a hollow, elongated finger protruding into said evacuable chamber;

ferromagnetic means axially movable internally of said hollow finger and being partitioned from the region of subatmospheric pressure within said evacuable chamber by the walls of said hollow finger;

slider means axially movable of said elongated finger on the outside of said finger and being magnetically coupled to said ferromagnetic means internally of said finger for movement therewith;

wafer carrier means mechanically coupled to and movable with said slider means for transferring wafers between said wafer storage box and said evacuated wafer coating station; and forcing means operable within said finger for moving said ferromagnetic means within said finger to produce a corresponding axial movement of said slider means and said wafer carrier means, whereby the operating life of said wafer transfer means is extended in use.

17. An evacuable wafer transport and storage box comprising:

a generally rectangular sidewall frame structure for containing an axial array of wafers;

a generally rectangular cover plate for covering one side of said rectangular sidewall frame structure; and a resilient sealing ring for disposition inbetween said cover plate and said sidewall frame structure at the lip of said sidewall frame structure for sealing said cover plate to said sidewall frame structure in a gas-tight manner.

18. The storage box of claim 17 including:

a second generally rectangular cover plate for covering a second side of said rectangular sidewall frame structure;

said covered second side of said rectangular sidewall frame structure being opposite to said first side of said frame structure, and;

a second resilient sealing ring for disposition inbetween said second cover plate and said sidewall frame structure at the lip of said sidewall frame structure for sealing said second cover plate to said sidewall frame structure in a gas-tight manner.

19. The storage box of claim 17 including wafer indexing means carried from and mechanically operatively associated with said rectangular sidewall structure for determining the positions of the individual wafers of the axial array of wafers contained within the wafer transport and storage box.

20. The storage box of claim 17 including box pickup means disposed at and mechanically operatively associated with an end wall of said rectangular sidewall structure for receiving in operative mechanical engagement a storage box transfer means for transfer of the wafer storage box within an evacuated wafer processing machine.

* * * * *

Notice of Adverse Decision in Interference

In Interference No. 102,255, involving Patent No. 4,676,884, J. A. Dimock, D. P. Woestenburg, WAFER PROCESSING MACHINE WITH EVACUATED WAFER TRANSPORTING AND STORAGE SYSTEM, final judgment adverse to the patentees was rendered Jan. 11, 1990, as to claims 1, 2, 4-6, 9 and 17.

(*Official Gazette May 8, 1990*)